US006680527B1

(12) United States Patent
Kawamoto

(10) Patent No.: US 6,680,527 B1
(45) Date of Patent: Jan. 20, 2004

(54) MONOLITHIC SEMICONDUCTING CERAMIC ELECTRONIC COMPONENT

(75) Inventor: Mitsutoshi Kawamoto, Hirakata (JP)

(73) Assignee: Murata Manufacturing Co. Ltd. (JP)

( * ) Notice: Subject to any disclaimer, the term of this patent is extended or adjusted under 35 U.S.C. 154(b) by 0 days.

(21) Appl. No.: 09/426,652

(22) Filed: Oct. 25, 1999

(30) Foreign Application Priority Data

Nov. 11, 1998 (JP) .......................................... 10-320573
Apr. 19, 1999 (JP) .......................................... 11-110238
May 20, 1999 (JP) .......................................... 11-140287

(51) Int. Cl.[7] ........................ H01L 23/12; H01L 23/053

(52) U.S. Cl. ........................ 257/700; 257/703; 257/705; 257/748; 257/758; 257/766; 257/773

(58) Field of Search ................................ 257/700, 748, 257/758, 766, 773, 795, 703, 705; 361/321.2, 321.3

(56) References Cited

U.S. PATENT DOCUMENTS 3,872,360 A * 3/1975 Sheard ........................ 317/258
4,889,760 A * 12/1989 Kippenberg et al. ......... 428/192
5,010,443 A * 4/1991 Maher ......................... 361/321
5,065,274 A 11/1991 Berghout et al.
5,082,810 A * 1/1992 Bergna et al. .............. 501/134
5,757,610 A * 5/1998 Wada et al. ................ 361/311
5,841,626 A 11/1998 Sano et al.
5,852,542 A * 12/1998 Wada et al. ............. 361/321.5

FOREIGN PATENT DOCUMENTS

JP 1-11302 1/1989
JP 1-233702 9/1989
JP 7-45402 2/1995
JP 9-162011 6/1997
JP 9-241074 9/1997
JP 10-139535 5/1998
JP 11-116327 4/1999

OTHER PUBLICATIONS

Japanese Office Action dated Dec. 17, 2002 (w/English translation of relevant portion).
Japanese Office Action dated Aug. 13, 2002 (w/English translation of relavant portion).

* cited by examiner

*Primary Examiner*—Allan R. Wilson
*Assistant Examiner*—Matthew E. Warren
(74) *Attorney, Agent, or Firm*—Dickstein, Shapiro, Morin & Oshinsky, LLP.

(57) ABSTRACT

A monolithic semiconducting ceramic electronic component includes barium titanate-based semiconducting ceramic layers and internal electrode layers alternately deposited, and external electrodes electrically connected to the internal electrode layers. The semiconducting ceramic layers contain ceramic particles having an average particle size of about 1 μm or less and the average number of ceramic particles per layer in the direction perpendicular to the semiconductor layers is about 10 or more. The internal electrode layers are preferably composed of a nickel-based metal.

16 Claims, 1 Drawing Sheet

MONOLITHIC SEMICONDUCTING CERAMIC ELECTRONIC COMPONENT

BACKGROUND OF THE INVENTION

1. Field of the Invention

The present invention relates to monolithic semiconducting ceramic electronic components, and in particular, the invention relates to a semiconducting ceramic component having barium titanate as a major constituent and having a positive temperature coefficient of resistance.

2. Description of the Related Art

Conventionally, barium titanate-based semiconducting ceramics have been widely used for applications such as temperature control, overcurrent protection, and isothermal heating because barium titanate-based semiconducting ceramics have positive resistance temperature characteristics (hereinafter referred to as "PTC characteristics") in which the resistivity is low at room temperature and the resistance abruptly increases at a temperature higher than the Curie Point. In particular, low room temperature resistance is desired in electronic components for overcurrent protection of circuits. In Universal Serial Bus (USB) computer peripheral equipment, small semiconducting ceramic components having low resistivity and high withstand voltage are required.

In response to such demands, a monolithic semiconducting ceramic electronic component is disclosed in Japanese Unexamined Patent Publication No. 57-60802. In the monolithic semiconducting ceramic electronic component, semiconducting ceramic layers having barium titanate as a major constituent and internal electrode layers composed of a Pt—Pd alloy are alternately deposited and integrally fired. By constructing such a multi-layered structure, the electrode area in the semiconducting ceramic electronic component greatly increases, and the size of the electronic component itself can be reduced. However, it is difficult to obtain ohmic contact between the internal electrode layers and the semiconductor layers in the monolithic semiconducting ceramic electronic component, resulting in a large increase in resistance at room temperature.

A monolithic semiconducting ceramic electronic component is also disclosed in Japanese Unexamined Patent Publication No. 6-151103 in which a Ni-based metal is used as a material for internal electrodes instead of the Pt—Pd alloy. The material for internal electrodes using the Ni-based metal is oxidized if fired in air, and therefore, after being fired in a reducing atmosphere, the material must be subjected to reoxidation treatment at a temperature which does not oxidize the Ni-based metal. Since ohmic contact between the internal electrodes and semiconducting ceramic layers can be obtained, an increase in resistance at room temperature can be avoided. However, since the reoxidation treatment at low temperatures is required to prevent the Ni-based metal from oxidizing, the width of resistivity variation is small at less than 2 units.

A monolithic semiconducting ceramic electronic component is also disclosed in Japanese Unexamined Patent Publication No. 1-11302 in which the average particle size of a semiconducting ceramic and the thickness of a semiconducting ceramic layer are taken into consideration. In the monolithic semiconducting ceramic electronic component, the thickness of the semiconductor layer is at least 5 times the average particle size of the semiconducting ceramic, and the average particle size of the semiconducting ceramic is 1 to 30 μm. By constructing such a structure, semiconducting ceramic layers and internal electrodes can be brought into ohmic contact with each other and degradation of the PTC characteristics can be avoided. However, the ceramic electronic component has an insufficient withstand voltage, resulting in problems in practical use.

SUMMARY OF THE INVENTION

It is an object of the present invention to provide a monolithic semiconducting ceramic electronic component in which the size of the electronic component itself can be reduced, the room temperature resistance is as low as about 0.2 Ω or less, the width of resistivity variation is about 2.5 units or more., and the withstand voltage is as high as about 10 V or more.

The present invention has been achieved in view of the object described above.

In a first aspect of the present invention, a monolithic semiconducting ceramic electronic component includes barium titanate-based semiconducting ceramic layers and internal electrode layers, which are alternately deposited, and external electrodes electrically connected to the internal electrode layers. The semiconducting ceramic layers contain ceramic particles having an average particle size of about 1 μm or less, and an average number of ceramic particles per layer in the direction perpendicular to the semiconducting ceramic layers is about 10 or more.

By constructing such a structure, the size will be reduced, and the semiconducting ceramic electronic component will have low resistance at room temperature, large width of resistivity variation and a high withstand voltage. That is, by setting the average particle size at about 1 μm or less, the withstand voltage can be improved. Since a larger number of ceramic particles are present per layer, the semiconducting ceramic layers can be thinner. By setting the average number of ceramic particles per layer in the direction perpendicular to the semiconducting ceramic layers at about 10 or more, an increase in the resistance at room temperature due to diffusion of internal electrode constituents into the semiconducting ceramic layers can be avoided.

In a second aspect of the present invention, the internal electrode layers are preferably composed of a nickel-based metal in the monolithic semiconducting ceramic electronic component.

By using the nickel-based metal as a material for the internal electrode layers, the semiconducting ceramic layers and the internal electrode layers are securely brought into ohmic contact with each other, thus enabling one to avoid an increase in resistance at room temperature and to increase the width of resistivity variation in the semiconducting ceramic electronic component. Even if reoxidation treatment is performed at low temperatures in order not to oxidize the internal electrodes composed of the nickel-based metal, the width of resistivity variation in the semiconducting ceramic electronic component can be increased.

DESCRIPTION OF THE PREFERRED EMBODIMENTS

Figure 1:
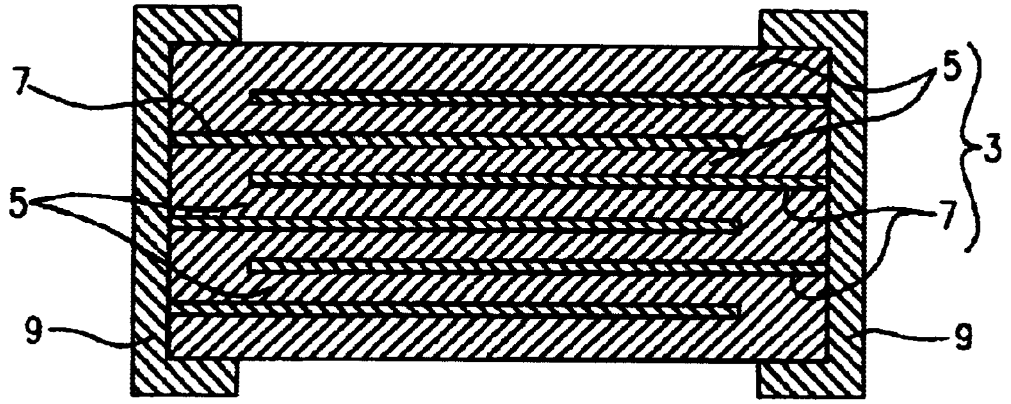
FIG. 1 is a schematic sectional view of a monolithic semiconducting ceramic electronic component in accordance with the present invention.

A monolithic semiconducting ceramic electronic component in the present invention includes semiconducting ceramic layers, internal electrode layers, and external electrode layers.

The semiconducting ceramic layers are composed of a semiconductor material having barium titanate as a major constituent, in which, as required, Ba may be partially substituted by Ca, Sr, Pb or the like, and Ti may be partially substituted by Sn, Zr or the like. As a dopant for imparting semiconductive characteristics to the semiconducting ceramic, a rare-earth element such as La, Y, Sm, Ce, Dy or Gd, or a transition element such as Nb, Ta, Bi, Sb or W may be used. In addition, an oxide or compound including Si, Mn or the like may be added to the semiconducting ceramic, as required.

The semiconducting ceramic layers include ceramic particles having an average particle size of about 1 $\mu$m or less. This is because of the fact that if the average particle size of ceramic particles is larger than about 1 $\mu$m, the withstand voltage of the semiconducting ceramic is decreased. As long as such ceramic particles are obtained, the preparation of barium titanate powder is not limited to a specific method. For example, a sol-gel process, hydrothermal synthesis, a coprecipitation method or solid-phase synthesis may be used. Preferably, in X-ray Photoelectron Spectroscopy ("XPS") observation, the $BaCO_3$/BaO ratio is about 0.42 or less, the lattice constant is about 0.4020 nm or more, and the Ba/Ti ratio is in the range from about 0.990 to 1.000. The sinter of barium titanate preferably has a relative intensity ratio of $BaCO_3$ to BaO of about 0.50 or less, in XPS observation.

In the semiconducting ceramic layers, the average number of ceramic particles per layer in the direction perpendicular to the semiconducting ceramic layers is about 10 or more. This is because of the fact that if the average number of ceramic particles per layer is less than about 10, diffusion of internal electrode constituents into the semiconducting ceramic layers increases and thus the room temperature resistivity of the semiconducting ceramic layers is increased, and also the withstand voltage is decreased in response to a decrease in the width of resistivity variation. The increase in room temperature resistivity due to diffusion of internal electrode constituents into the semiconducting ceramic layers is caused because the diffused internal electrode constituents are considered to substitute for titanium in the barium titanate and to become an acceptor.

Although the thickness of the semiconducting ceramic layer is adjusted in response to the required room temperature resistivity, preferably, the thickness is set at about 100 $\mu$m or less in order to avoid an increase in room temperature resistivity.

As a material for the internal electrodes, a Ni-based metal, a Mo-based metal, a Cr-based metal or an alloy thereof may be used. Preferably, the Ni-based metal is used in view of secure ohmic contact with the semiconducting ceramic layers.

As the external electrodes, although Ag, Pd or an alloy thereof may be used, the material is not limited to this.

The present invention will be described in more detail based on examples.

EXAMPLES

A method for fabricating monolithic semiconducting ceramic electronic components in the present invention will be described. FIG. 1 is a schematic sectional view of a monolithic semiconducting ceramic electronic component in accordance with the present invention.

Example 1

First, 15.40 l of 0.2 mol/l barium hydroxide solution (containing 3.079 mol of Ba) and 7.58 l of 0.35 mol/l Ti alkoxide solution (containing 2.655 mol of Ti) were prepared separately in vessels. In the Ti alkoxide solution, titanium tetraisopropoxide was dissolved in isopropyl alcohol. Further, 100 cc of lanthanum chloride dissolved in ethanol (containing 0.00664 mol of La) was mixed into the Ti alkoxide solution homogeneously.

The solutions in the individual vessels were then blended with a static mixer to cause reaction and the resultant solution was kept in a maturing vessel for 3 hours. Next, dehydration and cleaning were performed, followed by drying at 110° C. for 3 hours. Pulverization was then performed to obtain fine barium titanate powder containing La. The fine barium titanate powder containing La had a Ba/Ti ratio of 0.993 and a La/Ti ratio of 0.0021.

The barium titanate powder containing La was calcined at 1,000° C. for 2 hours and an organic solvent, an organic binder, a plasticizer, etc. were added thereto to prepare ceramic slurry. By a doctor blade process, a ceramic green sheet was obtained. An internal electrode was formed by screen-printing a Ni electrode paste on the ceramic green sheet. The ceramic green sheets were laminated such that the electrodes were alternately exposed, and pressing was performed, followed by cutting, to form a laminate. In the laminate of the present invention, a dummy ceramic green sheet in which an internal electrode is not printed is provided and pressed over each of the upper and lower surfaces.

The laminate was then subjected to binder removal treatment in air, and firing was performed in a strong reducing atmosphere with a hydrogen/nitrogen ratio of 3/100 for 2 hours, and thus a multi-layered sinter 3 including semiconducting ceramic layers 5 and internal electrodes 7 was obtained. After the firing, reoxidation treatment was performed in air at 600 to 1,000° C. for one hour. Ohmic silver paste was applied to the surfaces for connection to the internal electrodes 7, and baking was performed in air to form external electrodes 9, and thus a monolithic semiconducting ceramic electronic component 1 was obtained.

In the monolithic semiconducting ceramic electronic component obtained as described above, by varying the thickness of the ceramic green sheets and the firing temperature, the average number of ceramic particles per layer in the direction perpendicular to the semiconducting ceramic layers and the average particle size of the ceramic particles were varied. Further, by varying the number of depositions of the semiconducting ceramic layers, the room temperature resistance was adjusted. The average number of ceramic particles per layer was observed with SEM by selecting any 10 spots of a polished cross section in which the semiconducting ceramic layers were embedded and etched. The average particle size of the ceramic particles was computed by analyzing the SEM photograph images of the surfaces and cross sections of the samples. Next, the room temperature resistance, the width of resistivity variation and the withstand voltage were measured with respect to the individual samples. The room temperature resistance was measured by a four-terminal method, using a digital voltmeter. The width of resistivity variation (units) was calculated by dividing the maximum resistance by the minimum resistance in the range from room temperature to 250° C., and using the common logarithm thereof. The withstand voltage was set as the maximum applied voltage immediately before breakdown of the element. The results are shown in Table 1. An asterisk in the table indicates that the sample is out of the scope of the present invention.

TABLE 1

| Sample No. | Average Particle Size of Ceramic Particles (μm) | Average Number of Particles per Layer (Piece) | Room Temperature Resistance (Ω) | Width of Resistivity Variation (Unit) | Withstand Voltage (V) |
|---|---|---|---|---|---|
| 1 | 0.8 | 40 | 0.19 | 3.7 | 25 |
| 2 | 0.9 | 40 | 0.18 | 3.6 | 22 |
| 3 | 1 | 40 | 0.17 | 3.5 | 20 |
| *4 | 2 | 40 | 0.15 | 3.2 | 8 |
| *5 | 5 | 40 | 0.13 | 3.0 | 6 |
| *6 | 0.8 | 5 | 0.9 | 1.5 | 4 |
| *7 | 0.8 | 8 | 0.7 | 2.0 | 5 |
| 8 | 0.8 | 10 | 0.08 | 2.9 | 14 |
| 9 | 0.8 | 20 | 0.14 | 3.3 | 16 |
| 10 | 0.8 | 40 | 0.18 | 3.6 | 25 |

As is obvious from Table 1 the room temperature resistance is less than 0.2 Ω, the width of resistivity variation is 2.5 units or more and the withstand voltage is 10 V or more in the samples having an average particle size of the ceramic particles of about 1 μm or less and an average number of ceramic particles in the direction perpendicular to the semiconducting ceramic layer of about 10 or more.

Example 2

Apart from the fact that the calcining temperature was set at 1,100° C., monolithic semiconducting ceramic electronic components were fabricated in a manner similar to that in example 1, and the room temperature resistance, the width of resistivity variation, and the withstand voltage were measured. The results are shown in Table 2. An asterisk in the table indicates that the sample is out of the scope of the present invention.

TABLE 2

| Sample No. | Average Particle Size of Ceramic Particles (μm) | Average Number of Particles per Layer (Piece) | Room Temperature Resistance (Ω) | Width of Resistivity Variation (Unit) | Withstand Voltage (V) |
|---|---|---|---|---|---|
| 11 | 0.8 | 40 | 0.19 | 3.9 | 30 |
| 12 | 0.9 | 40 | 0.18 | 3.8 | 26 |
| 13 | 1 | 40 | 0.17 | 3.7 | 25 |
| *14 | 2 | 40 | 0.15 | 3.2 | 8 |
| *15 | 5 | 40 | 0.13 | 3.0 | 6 |
| *16 | 0.8 | 5 | 0.9 | 1.5 | 4 |
| *17 | 0.8 | 8 | 0.7 | 2.0 | 5 |
| 18 | 0.8 | 10 | 0.08 | 3.4 | 20 |
| 19 | 0.8 | 20 | 0.14 | 3.5 | 23 |
| 20 | 0.8 | 40 | 0.18 | 3.8 | 28 |

As shown in Table 2, with respect to the samples calcined at 1,100° C., when the average particle size of ceramic particles is about 1 μm or less, and when the average number of ceramic particles in the direction perpendicular to the semiconducting ceramic layers is about 10 or more, the room temperature resistance is less than 0.2 Ω, the width of resistivity variation is 3.0 units or more, and the withstand voltage is 20 V or more, thus exhibiting particularly excellent characteristics.

Based on the measurement results in examples 1 and 2, the reasons for limiting the average particle size of the ceramic particles and the average number of ceramic particles in the direction perpendicular to the semiconducting ceramic layers will be described below.

The average particle size of the ceramic particles is set at about 1 μm or less because, as is obvious from sample Nos. 4, 5, 14, and 15, when the average particle size of the ceramic particles is more than 1 μm, the withstand voltage will be lower than 20 V, which is undesirable.

The average number of ceramic particles in the direction perpendicular to the semiconducting ceramic layers is set at about 10 or more because, as is obvious from sample Nos. 6, 7, 16, and 17, when the average number of ceramic particles in the direction perpendicular to the semiconducting ceramic layers is less than 10, the room temperature resistance is largely increased, and the width of resistivity variation and the withstand voltage are largely decreased, which is undesirable.

In a monolithic semiconductor electronic component in the present invention, barium titanate-based semiconducting ceramic layers and internal electrode layers are alternately deposited and external electrodes are formed so as to be electrically connected to the internal electrode layers. Ceramic particles constituting the semiconducting ceramic layers, each of which is disposed between the internal electrode layers, have an average particle size of about 1 μm or less and the average number of ceramic particles in the direction perpendicular to the semiconducting ceramic layers is about 10 or more. Thus, the size of the component can be reduced, and the semiconducting ceramic electronic component can have a low room temperature resistance, a wide resistivity variation, and a high withstand voltage.

Since the internal electrodes are composed of a nickel-based metal, the semiconducting ceramic layers and the internal electrodes can be securely brought into ohmic contact with each other, an increase in the room temperature resistance can be avoided and the width of resistivity variation can be increased.

What is claimed is:

1. A monolithic semiconducting ceramic electronic component comprising:

a plurality of alternating barium titanate semiconducting ceramic layers and internal electrode layers; and external electrodes electrically connected to the internal electrode layers;

wherein the barium titanate semiconducting ceramic layers comprise sintered ceramic particles having an average particle size of about 1 μm or less and an average number of ceramic particles per layer in a direction perpendicular to the barium titanate semiconductor ceramic layers is about 10 or more, and wherein the semiconducting ceramic electronic component has a room temperature resistance of about 0.2 Ω or less, a width of resistivity variation of about 2.5 units or more and a withstand voltage of about 10 volts or more.

2. A monolithic semiconducting ceramic electronic component according to claim 1, wherein the internal electrode layers comprise nickel.

3. A monolithic semiconducting ceramic electronic component according to claim 2, wherein the ceramic particles have an average particle size of 0.8 to 1 μm.

4. A monolithic semiconducting ceramic electronic component according to claim 3, wherein the average number of ceramic particles per layer in the direction perpendicular to the semiconductor layers is 10 to 40.

5. A monolithic semiconducting ceramic electronic component according to claim 4, which has under XPS observation a ratio of $BaCO_3$/BaO of about 0.42 or less, a lattice constant of about 0.4020 nm or more, a ratio of Ba/Ti in the range from about 0.990 to 1.000 and a relative intensity ratio of $BaCO_3$ to BaO is about 0.50 or less.

6. A monolithic semiconducting ceramic electronic component according to claim 1, wherein the ceramic particles have an average particle size of 0.8 to 1 μm.

7. A monolithic semiconducting ceramic electronic component according to claim 6, wherein the average number of ceramic particles per layer in the direction perpendicular to the semiconductor layers is 10 to 40.

8. A monolithic semiconducting ceramic electronic component according to claim 1, wherein the average number of ceramic particles per layer in the direction perpendicular to the semiconductor layers is 10 to 40.

9. A monolithic semiconducting ceramic electronic component according to claim 1, which has under XPS observation a ratio of $BaCO_3$/BaO of about 0.42 or less, a lattice constant of about 0.4020 nm or more, a ratio of Ba/Ti in the range from about 0.990 to 1.000 and a relative intensity ratio of $BaCO_3$ to BaO of about 0.50 or less.

10. A monolithic semiconducting ceramic electronic component according to claim 1, wherein the barium in the barium titanate is partially substituted by Ca, Sr or Pb.

11. A monolithic semiconducting ceramic electronic component according to claim 1, wherein the titanium in the barium titanate is partially substituted by Sn or Zr.

12. A monolithic semiconducting ceramic electronic component according to claim 1, wherein the barium titanate is doped.

13. A monolithic semiconducting ceramic electronic component according to claim 12, wherein the barium titanate is doped with La.

14. A monolithic semiconducting ceramic electronic component according to claim 13, wherein the internal electrode layers comprise nickel.

15. A monolithic semiconducting ceramic electronic component according to claim 14, wherein the ceramic particles have an average particle size of 0.8 to 1 μm.

16. A monolithic semiconducting ceramic electronic component according to claim 15, wherein the average number of ceramic particles per layer in the direction perpendicular to the semiconductor layers is 10 to 40.

* * * * *